United States Patent [19]

Iida

[11] Patent Number: 4,873,525
[45] Date of Patent: Oct. 10, 1989

[54] COMPACT R SEGMENT D/A CONVERTER

[75] Inventor: Tetsuya Iida, Yokohama, Japan

[73] Assignee: Kabushiki Kaisha Toshiba, Kawasaki, Japan

[21] Appl. No.: 165,702

[22] Filed: Mar. 8, 1988

[30] Foreign Application Priority Data

Mar. 13, 1987 [JP] Japan .................................. 62-58128

[51] Int. Cl.$^4$ ............................................. H03M 1/68
[52] U.S. Cl. ..................................... 341/145; 341/150
[58] Field of Search ................ 341/145, 150, 153, 156

[56] References Cited

U.S. PATENT DOCUMENTS

| | | | |
|---|---|---|---|
| 3,997,892 | 12/1976 | Susset | 341/145 |
| 4,200,863 | 4/1980 | Hodges et al. | 340/347 |
| 4,384,277 | 5/1983 | Allgood et al. | 341/150 |
| 4,611,195 | 9/1986 | Shosaku | 341/145 |
| 4,618,847 | 10/1986 | Iida et al. | 341/145 |
| 4,647,903 | 3/1987 | Ryu | 341/145 |

*Primary Examiner*—William M. Shoop Jr.
*Assistant Examiner*—Marc S. Hoff

*Attorney, Agent, or Firm*—Finnegan, Henderson, Farabow, Garrett & Dunner

[57] ABSTRACT

A digital-to-analog converter includes a group of resistors serially connected between a power source potential supply terminal and a reference potential supply terminal. First group switches are connected between a first circuit point and given serial connection nodes of the resistor group, and between the first circuit point and the reference potential supply terminal. Each of these switches is controlled so as to be selectively turned on according to the result obtained from decoding upper bits of a digital signal. Further, second group switches are connected between a second circuit point and other serial connection nodes of the resistor group, and between the second circuit point and the reference potential supply terminal. Each of these switches is controlled so as to be selectively turned on according to the result obtained from decoding lower bits of the digital signal. First and second capacitors are connected between an output terminal and the first circuit points, and between the output terminal and the second circuit point, respectively.

11 Claims, 3 Drawing Sheets

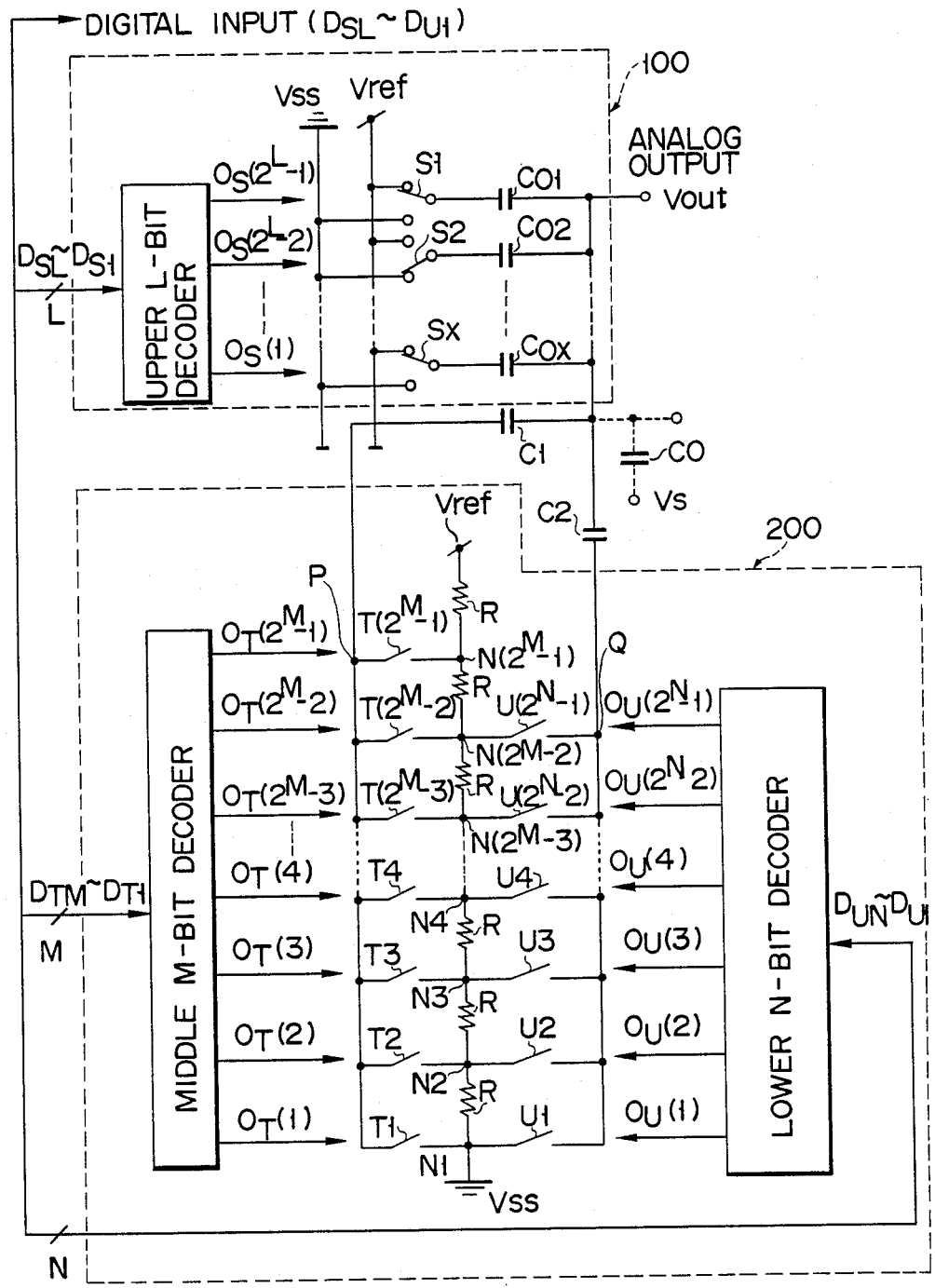
F I G. 2

COMPACT R SEGMENT D/A CONVERTER

BACKGROUND OF THE INVENTION

1. Field of the Invention

This invention relates to a digital-to-analog converter for converting a digital signal to an analog signal, and more particularly, to a digital-to-analog converter suitable for digital audio devices or the like.

2. Description of the Related Art

For a digital-to-analog (D/A) converter used in digital audio devices or the like, it is necessary to attain a monotonic increase in a D/A conversion output (that is, linear characteristic of D/A conversion) while reducing the size of the D/A converter. To meet the requirement, a digital-to-analog (D/A) converter has been used which employs capacitor arrays and resistor segments as described in U.S. Pat. No. 4,200,863, for example.

The D/A converter described in this patent includes capacitor arrays (C1 to C256) and resistor segments (R1 to R16) to constitute an A/D converter for converting analog input signal Vin to a 12-bit digital signal, as is shown in FIG. 4. It also has a function as a D/A converter for converting a 12-bit digital signal to an analog signal.

That is, when the A/D converter shown in FIG. 4 is operated as a D/A converter, it converts the upper 8 bits of a digital signal by using 8-bit capacitor arrays which are binary-weighted and converts the lower 4 bits by using resistor segments R1 to R16.

In the case where such a D/A converter is used to D/A convert a digital signal, no serious problem arises if the bit number of units of the digital signal is small. However, in the case of an IC for D/A converting a digital signal having a large number of bits, there is a problem because the total area of the capacitors required is greatly increased and the number of resistors used is increased significantly.

For example, in the case where the D/A converter is used for 16-bit D/A conversion which is conventionally utilized in digital audio devices, and upper and lower 8 bits are D/A converted by using the capacitor arrays and resistor segments, respectively, then total capacitor area Cs required on the upper bit side can be expressed as follows:

$$Cs = \left( \sum_{i=1}^{8} 2^{i-1} \cdot C \right) + C = 256C$$

where C is a minimum capacitor area.

Likewise, the number Rs of resistors required on the lower bit side can be expressed as follows:

$$Rs = 2^8 = 256R$$

Thus, when a 16-bit digital signal is converted to an analog signal, a total of 256 capacitors C and 256 resistors R are needed, making the IC chip area remarkably large. Furthermore, such an increase in the number of elements leads to a high cost of the D/A converter.

SUMMARY OF THE INVENTION

The present invention has been conceived in view of the fact described above, and has an object to provide a digital-to-analog converter which can improve the problem that the number of resistors and capacitors used increases with increase in the number of bits of a digital signal to be converted to the prior art D/A converter, thus increasing the chip area required for formation for the D/A converter, and which can effectively convert a digital signal of a large number of bits to an analog signal by using a reduced number of elements.

A digital-to-analog converter according to this invention comprises a group of resistors serially connected between power source potential and reference potential supply terminals; a first group of switches, connected between a first circuit point and a predetermined serial connection node on the resistor group and between the first circuit point and the reference potential supply terminal, and controlled so that one of them is selectively turned on according to the result of decoding upper bits (n) of a digital signal; a second group of switches, connected between a second circuit point and a predetermined serial connection node on the resistor group and between the second circuit point and the reference potential supply terminal, and controlled so that one of them is selectively turned on according to the result of decoding lower bits (N) of the digital signal; and first and second capacitors respectively connected between an output terminal and the first circuit point, and between the output terminal and the second circuit point.

In the digital-to-analog converter described above, the D/A conversion is effected by using substantially two digital-to-analog converter sections for the respective upper bits (M) and lower bits (N) so that the number of resistors required for D/A conversion can be reduced to a great extent.

The D/A converter may further include a third group of switches which are controlled to be selectively connected at one end to the power source potential or reference potential supply terminal according to the result of decoding for the digital signal; and a group of capacitors each connected between the other end of the switches of the third group and the output terminal.

In the D/A converter with this construction, if the third group of switches are controlled according to the result of decoding for the upper bits of the digital signal, the first group of switches are controlled according to the result of decoding for the middle digit bits, and the second group of switches are controlled according to the result of decoding for the lower bits, then a D/A conversion output a monotonic increase (i.e. linear characteristic of D/A conversion) can be attained because of the segment type capacitor array.

BRIEF DESCRIPTION OF THE DRAWINGS

FIG. 2 is a block diagram showing the construction of a D/A converter according to another embodiment of this invention;

DETAILED DESCRIPTION OF THE PREFERRED EMBODIMENTS

An embodiment of the present invention will now be described, with reference to the accompanying drawings.

Figure 1:
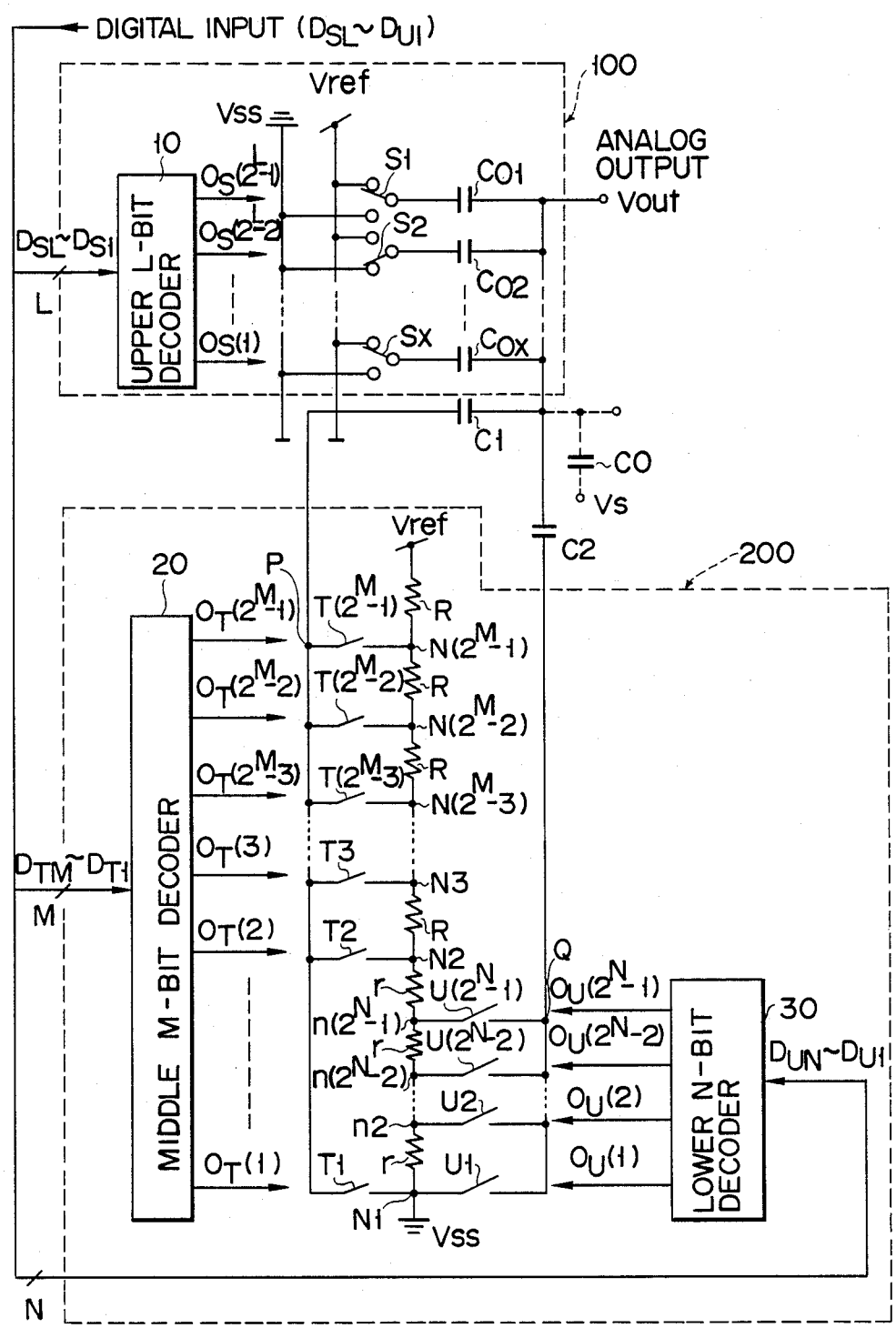
FIG. 1 is a block diagram showing the construction of a D/A converter according to one embodiment of this invention.

FIG. 1 shows a D/A converter according to one embodiment of this invention. In the D/A converter, D/A conversion for upper L bits of digital input (DSL to DS1) is effected by a segment type capacitor array (Co1 to Cox), and D/A conversion for middle and lower (M+N) bits is effected by substantially two resistor segment type D/A converter sections.

Figure 3:
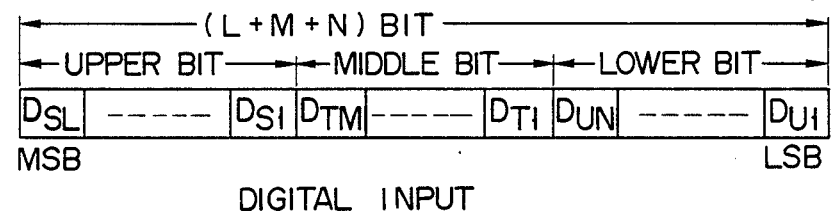
FIG. 3 is a diagram showing an example of the bit construction of digital data supplied to the D/A converter of FIG. 1 or 2.

As is shown in FIG. 3, the digital input is constructed to include three portions: upper L bits (DSL to DS1), middle M bits (DTM to DT1), and lower N bits (DUN to DU1). Data of the upper, middle, and lower bits are respectively decoded by decoders 10, 20, and 30. Decoders 10, 20, and 30 respectively perform decoding operations of those shown in truth tables of tables 1, 2, and 3.

| Truth Table 1 for Upper L-Bit Decoder | |
|---|---|
| Digital Input signal DSL ------------- DS1 | Decoder Output OS($2^L$ − 1) ---------- OS(1) |
| 0 -------------- 0 | 0 ---------------- 0 |
| 0 -------------- 01 | 0 ---------------- 01 |
| 0 -------------- 010 | 0 ---------------- 011 |
| 0 -------------- 011 | 0 ---------------- 0111 |
| . | . |
| . | . |
| 1 -------------- 1 | 1 ---------------- 1 |

| Truth Table 2 for Middle M-Bit Decoder | |
|---|---|
| Digital Input Signal DTM ------------- DT1 | Decoder Output OT(2M − 1) --------- OT(1) |
| 0 -------------- 0 | 0 ------------- 01 |
| 0 -------------- 01 | 0 ------------- 010 |
| 0 -------------- 010 | 0 ------------- 0100 |
| 0 -------------- 011 | 0 ------------- 01000 |
| . | . |
| . | . |
| 1 -------------- 1 | 10 ------------- 0 |

| Truth Table 3 for Lower N-bit Decoder | |
|---|---|
| Digital Input Signal DUN ------------- DU1 | Decoder Output OU(2N − 1) --------- OU(1) |
| 0 -------------- 0 | 0 ------------- 01 |
| 0 -------------- 01 | 0 ------------- 010 |
| 0 -------------- 010 | 0 ------------- 0100 |
| 0 -------------- 011 | 0 ------------- 01000 |
| . | . |
| . | . |
| 1 -------------- 1 | 10 ------------- 0 |

Upper bit D/A converter section 100 for D/A converting upper L bits includes ($2^L-1$) switches S1 to Sx ($x=2^L-1$) which are controlled to be set to reference potential Vref position or to ground potential Vss position by decoder outputs OS1 to OS($2^L$) from upper L-bit decoder 10, and ($2^L-1$) capacitors Co1 to Cox which are respectively connected at one end to switches S1 to Sx and commonly connected at the other end to output potential terminal Vout. In this embodiment, capacitors Co1 to Cox have the same capacitance (C).

In D/A converter 100, switches of S1 to Sx corresponding in number to the contents of L-bit digital signals DSL to DS1, are connected to reference potential terminal Vref. Thus, output voltage Vout is increased by Vref/$2^L$ each time the content of upper L-bit digital signals DSL to DS1 is increased by "1".

In D/A converter 200 for middle and lower (M+N) bits, middle M-bit decoder 20 and lower N-bit decoder 30 are used, and ($2^M-1$) first resistors R and $2^N$ second resistors r are serially connected between reference potential terminal Vref and ground potential terminal Vss. In this embodiment, the relation between first resistor R and second resistor r is set as follows:

$$R = 2^N \cdot r \ldots \quad (1)$$

$2^M$ switches T($2^M-1$) to T1 are connected at one end to serial connection nodes N($2^M-1$) to N3 of first resistors R, connection node N2 between first resistor R and second resistor r, and connection node N1 between second resistor r and reference potential terminal Vss. Switches T($2^M-1$) to T1 are commonly connected at the other end P to one electrode of capacitor C1. Capacitor C1 has the same capacitance (C) as capacitors Co1 to Cox and is connected at the other electrode to output potential terminal Vout.

The switching states of $2^M$ switches T are controlled according to the result OT($2^M-1$) to OT(1) of decoding middle M-bit digital signals DTM to DT1, and one of switches T is selectively turned on according to the content of M-bit digital signal OT. The potential at that node (for example, N3) connected to one end of turned-on switch T (for example, T3), or the middle M-bit D/A conversion output, is capacitively coupled to the output of capacitor array type upper L-bit D/A converter section 100, via capacitor C1. The middle M-bit D/A conversion output causes the value of output potential Vout to be increased by Vref/$2^{(L+M)}$[. . . (2)] each time the content of M-bit digital signal OT is increased by "1".

Likewise, $2^N$ switches U($2^N-1$) to U1 are connected at one end to serial connection nodes n($2^n-1$) to n2 of second resistors r, and connection node N1 between second resistor r and ground potential terminal Vss. Switches U($2^N-1$) to U1 are commonly connected at the other end Q to one electrode of capacitor C2 which has the same capacitance as capacitor C1 and which is connected at the other electrode to output potential terminal Vout.

The switching states of $2^N$ switches U are controlled according to the result OU($2^N-1$) to OU(1) of decoding lower N-bit digital signals DUN to DU1, and one of switches U is selectively turned on according to the content of N-bit digital signal. The potential at that node (for example, n2) connected to one end of turned-on switch U (for example, U2), or the lower N-bit D/A conversion output, is capacitively coupled via capacitor C2 to the output of capacitor array type upper L-bit D/A converter section 100 to which the middle M-bit D/A conversion output is capacitively coupled. The lower N-bit D/A conversion output causes the value of output potential Vout to be increased by $$Vref/2^{(L+M+N)} \ldots \quad (3)$$

each time the content of the N-bit digital signal is increased by "1". The switching states of switches S, T, and U are, for example, shown as follows:

| Table 4 for Switching Connection States | | |
|---|---|---|
| Switch | Decoder Output | Switch Connection State |
| S | OS(i) = 1 | Vref side |
|  | OS(i) = 0 | Vss side |
| T | OT(j) = 1 | ON |
|  | OT(j) = 0 | OFF |
| U | OU(k) = 1 | ON |
|  | OU(k) = 0 | OFF | where $1 \leq i \leq 2^L - 1$, $1 \leq j \leq 2^M - 1$, and $1 \leq k \leq 2^N - 1$.

Thus, the D/A converter of FIG. 1 practically uses two D/A converter sections (20+R, 30+r) to effect D/A conversion for the middle and lower (M+N) bits, and produces an output, obtained by capacitively coupling the respective D/A conversion outputs to the upper L-bit D/A conversion output, via capacitors C1 and C2.

When the D/A converter is used to convert a 16-bit digital signal to an analog signal and if L, M, and N are respectively set to 8, 4, and 4, then total capacitor area Cs required for the D/A converter is obtained as follows:

$$Cs = \left( \sum_{i=1}^{8} 2^{i-1} \cdot C \right) + C1 + C2 = 257C \quad (4)$$

However, the number Rs of resistors required for the D/A converter is obtained as follows:

$$Rs = 2^4 \cdot R + 2^4 \cdot r = 16R + 16r \quad (5)$$

Figure 4:
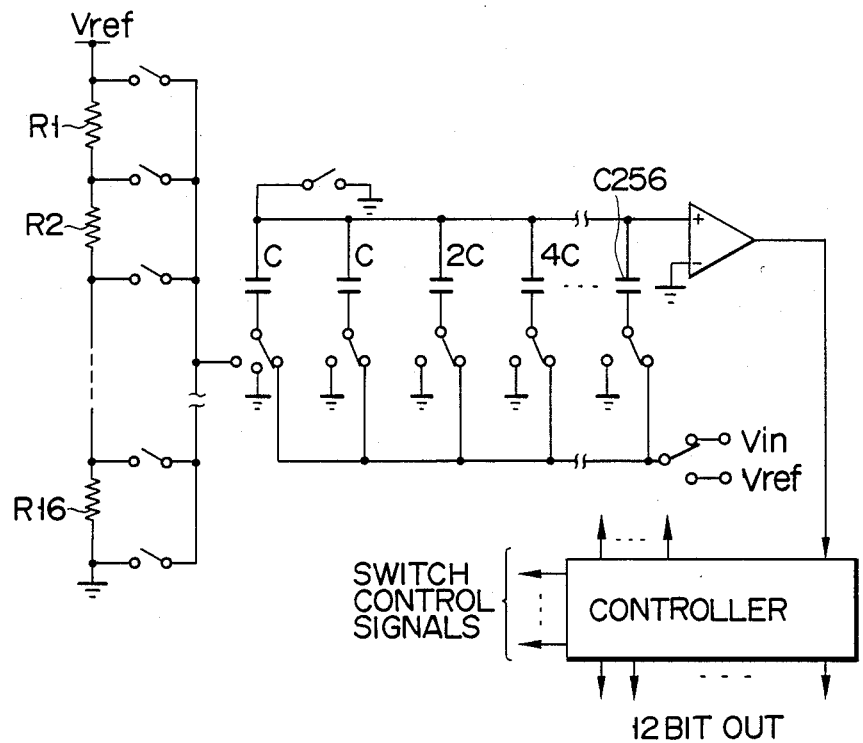
FIG. 4 is a block diagram showing the construction of the prior art D/A converter.

That is, 32 resistors are required in total, and the chip area required for forming the resistors (16 resistors R and 16 resistors r) can be reduced to a great extent in comparison with the prior art D/A converter of FIG. 4 in which 256 resistors R are required.

In the embodiment of FIG. 1, D/A conversion for the upper L bits is effected by a segment type capacitor array using the same capacitance (Co1 to Cox=C), instead of binary-weighted capacitor array. Therefore, a D/A conversion output having good linearity characteristic can be obtained, without any influence caused by variation in the capacitance of the capacitors in the manufacturing process.

In the case where high precision D/A conversion is not strictly required, the aforementioned D/A converter section for the upper L bits can be constructed by capacitor arrays which are binary-weighted (Co1=C, Co2=2C, Co3=4C, ...) in the same manner as in the prior art D/A converter of FIG. 4. In this case, switches S1 to Sx can be directly turned on or off by upper L bits DSL to DS1 without using decoder 10.

It is also possible to effect D/A conversion for all the bits of a digital signal by means of resistors R and r, switches S and U, and capacitively coupling capacitors C1 and C2 without using D/A converter 100 having capacitor arrays. However, in this case, it is preferable to connect one electrode of capacitor C0 to output potential terminal Vout. Capacitor C0 is shown in FIG. 1 by broken lines and connected at the other electrode to predetermined potential supply terminal Vs. With this connection, the level of output potential Vout can be precisely set by a ratio between the capacitances of capacitors C1 and C0.

FIG. 2 shows a second embodiment of this invention. The D/A converter of FIG. 2 is similar to that of FIG. 1 in that the upper L bits of a digital input (DSL to DS1) are D/A converted by means of $(2^N - 1)$ segment type capacitor arrays (Co1 to Cox), and the middle and lower (M+N) bits are D/A converted by means of substantially two D/A converter sections. However, in the D/A converter of FIG. 2, the value of capacitive coupling capacitor C2 is weighted, instead of effecting the weighting by resistors r.

That is, $2^N$ switches $U(2^N - 1)$ to U1 are connected at one end to serial connection nodes $N(2^M - 2)$ to N2 of resistors R and connection node N1 between resistor R and ground potential terminal Vss, in the same manner as switches $T(2^M - 2)$ to T1, and commonly connected at the other end to one electrode of capacitor C2 whose capacitance is weighted to $C1/2^N$.

When the capacitance of capacitor C1 is set equal to that of capacitors Co1 to Cox provided in the D/A converter section for upper L bits, the middle M-bit D/A conversion output causes the value of output potential Vout to be increased by $Vref/2^{(L+M)}$ each time the content of M-bit digital signals DTM to DT1 is increased by "1". The lower N-bit D/A conversion output causes output potential Vout to be increased by $Vref/2^{(L+M+N)}$ due to the capacitive coupling by capacitor C2 each time the content of N-bit digital signals DUN to DU1 is increased by "1".

With the D/A converter of this construction, since resistor R can be commonly used for switches T and U, it is possible to make the number of resistors, required for D/A converting the middle and lower (M+N) bits, smaller than that in the D/A converter of FIG. 1.

In this case, it is possible to perform D/A conversion for all the bits of a digital signal only by using resistors R, switches S and U, and capacitive coupling capacitors C1 and C2, without using the D/A converter section having the capacitor array. However, in this case, it is necessary to connect one electrode of capacitor Co, which is connected at the other electrode to a predetermined potential supply terminal, to output terminal Vout.

In FIG. 1 or 2, resistors R and r may be replaced by diodes or LEDs which are biased in the forward direction. That is, elements R and r are not limited to resistors if desired stable voltages can be derived from connection nodes (N1, N2, N3 ...) between elements R and r.

As described above, according to this invention, a digital signal of a large number of bits can be effectively converted to an analog signal by use of a small number of elements. Further, a monotonic or linear increasing characteristic of a D/A conversion output can be further improved by using segment type capacitor arrays to construct the upper bit D/A converting section.

In order to further support the contents of this invention, the descriptions disclosed in the following U.S. Patents are incorporated in this invention:

(1) U.S. Pat. No. 4,200,863 issued on Apr. 29, 1980 (Hodges et al.)

(2) U.S. Pat. No. 4,618,847 issued on Oct. 21, 1986 (Iida et al.)

What is claimed is:

1. A digital-to-analog converter comprising:

a group of resistors serially connected between a power source potential supply terminal and a reference potential supply terminal;

a first group of switches, connected between a first circuit point and a predetermined serial connection node on said resistor group and between the first circuit point and said reference potential supply terminal, and controlled so that one of them is selectively turned on according to upper bits of a digital signal;

a second group of switches, connected between a second circuit point and a predetermined serial connection node on said resistor group and between the second circuit point and said reference potential supply terminal, and controlled so that one of them is selectively turned on according to lower bits of the digital signal; and first and second capacitors connected between an output terminal and said first circuit point, and between the output terminal and said second circuit point, respectively.

2. A digital-to-analog converter according to claim 1, wherein:

said resistor group includes a first group of serially connected resistors each having a first resistance, and a second group of serially connected resistors each having a second resistance, said first and second resistor groups being connected in series with each other, and the total sum of said second group of resistors being set equal to the first resistance;

the switches in said first switching group are connected between respective corresponding serial connection nodes of the resistors in said first resistor group and said first circuit point, between said first circuit point and the serial connection node between said first and second resistor groups, and between said reference potential supply terminal and said first circuit point;

the switches in said second switching group are connected between respective corresponding serial connection nodes of the resistors in said second resistor group and said second circuit point, and between said reference potential supply terminal and said second circuit point; and the capacitance of said first capacitor is substantially equal to that of said second capacitor.

3. A digital-to-analog converter according to claim 1, wherein: said resistor group is formed of a series of resistors having substantially the same resistance;

the switches in said first switching group are connected between respective corresponding serial connection nodes of the resistors in said resistor group and said first circuit point, and between said reference potential supply terminal and said first circuit point;

the switches in said second switching group are connected between respective corresponding serial connection nodes of the resistors in said resistor group and said second circuit point, and between said reference potential supply terminal and said second circuit point; and the capacitance of said second capacitor is substantially equal to a value which is obtained by dividing the capacitance of said first capacitor by the number of the switches constituting said second switching group.

4. A digital-to-analog converter comprising:

a group of resistors serially connected between a power source potential supply terminal and a reference potential supply terminal;

a first group of switches, connected between a first circuit point and predetermined serial connection nodes on said resistor group and between the first circuit point and said reference potential supply terminal, and controlled so that one of them is selectively turned on according to the result of decoding middle bits of a digital signal;

a second group of switches, connected between a second circuit point and predetermined serial connection nodes on said resistor group and between the second circuit point and said reference potential supply terminal, and controlled so that one of them is selectively turned on according to the result obtained from decoding lower bits of the digital signal;

a third group of switches whose one ends are respectively controlled to be selectively connected to said power source potential supply terminal or reference potential supply terminal, according to the result obtained from decoding upper bits of the digital signal;

a group of capacitors respectively connected between the other ends of the switches in said third switching group and an output terminal; and first and second capacitors respectively connected between the output terminal and said first circuit point, and between the output terminal and said second circuit point, respectively.

5. A digital-to-analog converter according to claim 4, further comprising an output capacitor connected between a given fixed potential circuit and said output terminal.

6. A digital-to-analog converter according to claim 4, wherein: said resistor group includes a first group of serially connected resistors each having a first resistance, and a second group of serially connected resistors each having a second resistance, said first and second resistor groups being connected in series with each other, and the total sum of said second group of resistors being set equal to the first resistance;

the switches in said first switching group are connected between respective corresponding serial connection nodes of the resistors in said first resistor group and said first circuit point, between said first circuit point and the serial connection node between said first and second resistor groups, and between said reference potential supply terminal and said first circuit point;

the switches in said second switching group are connected between respective corresponding serial connection nodes of the resistors in said second resistor group and said second circuit point, and between said reference potential supply terminal (Vss) and said second circuit point; and the capacitances of said first and second capacitors are substantially equal to the capacitance of the capacitors of said capacitor group.

7. A digital-to-analog converter according to claim 6, further comprising an output capacitor connected between a given fixed potential circuit and said output terminal.

8. A digital-to-analog converter according to claim 4, wherein: said resistor group is formed of a series of resistors having substantially the same resistance;

the switches in said first switching group are connected between respective corresponding serial connection nodes of the resistors in said resistor group and said first circuit point, and between said reference potential supply terminal and said first circuit point;

the switches in said second switching group are connected between respective corresponding serial connection nodes of the resistors in said resistor group and said second circuit point, and between said reference potential supply terminal and said second circuit point; and the capacitance of said first capacitor is substantially equal to that of the capacitors of said capacitor group, and the capacitance of said second capacitor is substantially equal to a value which is obtained by dividing the capacitance of said first capacitor by the number of the switches constituting said second switching group.

9. A digital-to-analog converter according to claim 8, further comprising an output capacitor connected between a given fixed potential circuit and said output terminal.

10. A digital-to-analog converter according to claim 4, wherein: said resistor group is formed of a series of resistors having substantially the same resistance;

the switches in said first switching group are connected between respective corresponding serial connection nodes of the resistors in said resistor group and said first circuit point, and between said reference potential supply terminal and said first circuit point;

the switches in said second switching group are connected between respective corresponding serial connection nodes of the resistors in said resistor group and said second circuit point, and between said reference potential supply terminal and said second circuit point; and the capacitance of said first capacitor is substantially equal to that of the capacitance of said capacitor group, and the capacitance of said second capacitor is substantially equal to a value which is obtained by dividing the capacitance of said first capacitor by the number of the switches constituting said second switching group.

11. A digital-to-analog converter according to claim 10, further comprising an output capacitor connected between a given fixed potential circuit and said output terminal.

* * * * *